United States Patent
Shin et al.

(10) Patent No.: US 7,813,217 B2
(45) Date of Patent: Oct. 12, 2010

(54) SEMICONDUCTOR MEMORY DEVICE AND METHOD FOR OPERATING THE SAME

(75) Inventors: Beom-Ju Shin, Kyoungki-do (KR); Sang-Sic Yoon, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 198 days.

(21) Appl. No.: 12/215,728

(22) Filed: Jun. 30, 2008

(65) Prior Publication Data

US 2009/0116299 A1    May 7, 2009

(30) Foreign Application Priority Data

Nov. 5, 2007   (KR) ...................... 10-2007-0112033
Nov. 5, 2007   (KR) ...................... 10-2007-0112037

(51) Int. Cl.
G11C 8/18   (2006.01)
(52) U.S. Cl. ............................... 365/233.13; 365/233.1
(58) Field of Classification Search .............. 365/233.1, 365/233.13
See application file for complete search history.

(56) References Cited

U.S. PATENT DOCUMENTS 7,342,412 B2 *   3/2008   Kim ............................ 326/30
2003/0218921 A1 *  11/2003  Schrogmeier et al. ........ 365/200
2006/0145894 A1 *   7/2006  Kim et al. ...................... 341/50
2007/0126468 A1 *   6/2007  Kim ............................ 326/30
2009/0274001 A1 *  11/2009  Jeong ....................... 365/233.1

FOREIGN PATENT DOCUMENTS

KR   1020060077551   7/2006
KR   1020070098038   10/2007

* cited by examiner

*Primary Examiner*—Huan Hoang
*Assistant Examiner*—Jay Radke
(74) *Attorney, Agent, or Firm*—Blakely, Sokoloff, Taylor & Zafman

(57) ABSTRACT

A semiconductor memory device is capable of generating a desired output enable signal without increasing an initial count value and bit number and generating a desired final output enable signal, without unnecessary reset operations, by reflecting column address strobe (CAS) latency information on an external clock count value. The semiconductor memory device includes a first output enable signal generating unit and a final output enable signal generating unit. The first output enable signal generating unit is configured to compare a first count value, which is obtained by counting a delay locked loop (DLL) clock, to a second clock count value, which is obtained by counting an external clock until a read command is input, and to output a first output enable signal. The final output enable signal generating unit is configured to output a final output enable signal generated by shifting the first output enable signal, according to CAS latency.

24 Claims, 11 Drawing Sheets

SEMICONDUCTOR MEMORY DEVICE AND METHOD FOR OPERATING THE SAME

CROSS-REFERENCE(S) TO RELATED APPLICATIONS

The present invention claims priority of Korean patent application numbers 10-2007-0112033 and 10-2007-0112037, respectively filed on Nov. 5, 2007, which are incorporated by reference in their entirety.

BACKGROUND OF THE INVENTION

The present invention relates to a semiconductor memory device, and more particularly to an output enable signal generator of a semiconductor memory device.

Generally, synchronous semiconductor memory devices such as a double data rate (DDR) synchronous dynamic random access memory (SDRAM) input and output data from/to the outside in response to an external clock (CLK_EXT). However, the semiconductor memory devices process data in response to an internal clock. In view of data, it changes the clock which the data is synchronized with. This is called a "domain crossing".

Several circuits are provided in semiconductor memory devices in order to ensure domain crossing. One of them is an output enable signal generator. The output enable signal generator is a circuit for enabling data transferred in synchronization with an internal clock to be output in synchronization with an external clock (CLK_EXT) after a column address strobe (CAS) latency.

FIG. 1 is a block diagram of a conventional output enable signal generator.

Referring to FIG. 1, the conventional output enable signal generator includes a counter reset signal generating unit 10, an initializing unit 20, a delay locked loop (DLL) clock counting unit 30, a delay model unit 40, an external clock counting unit 50, a latch unit 60, and a comparing unit 70.

The counter reset signal generating unit 10 outputs a first reset signal RST_DLL in response to a reset signal RST and a DLL clock CLK_DLL. The reset signal RST is a signal corresponding to an external command (for example, /RAS, /CAS, /CS, or /WE).

The initializing unit 20 provides an initial count value corresponding to a CAS latency (CL) to the DLL clock counting unit 30 in response to the first reset signal RST_DLL. The following Table 1 shows initial count values and signals S<0:2> output from the initializing unit 20 accordingly when the CAS latency is in the range of 3 to 7.

TABLE 1

| CL | Initial count value | S<2> | S<1> | S<0> |
|----|---------------------|------|------|------|
| 3  | 5                   | 1    | 0    | 1    |
| 4  | 4                   | 1    | 0    | 0    |
| 5  | 3                   | 0    | 1    | 1    |
| 6  | 2                   | 0    | 1    | 0    |
| 7  | 1                   | 0    | 0    | 1    |

FIG. 2 is a circuit diagram of the initializing unit 20 of FIG. 1.

Referring to FIG. 2, the initializing unit 20 is enabled in response to the first reset signal RST_DLL to generate signals S<0:2> and R<0:21> for resetting the DLL clock counting unit 30 according to the CAS latency. The CAS latency is a signal output from a mode register set (not shown) and has information on the number of cycles of the external clock CLK_EXT that elapses from the time when a read command (RD, see FIG. 4) in input to the time when data is output.

Referring again to FIG. 1, the DLL clock counting unit 30 counts the DLL clock CLK_DLL from the initial count value to output DLL clock count value CNT_DLL<0:2>. For example, assuming that the initial count value is set to 4 according to the CAS latency, the DLL clock counting unit 30 starts to count the DLL clock CLK_DLL from 4.

The delay model unit 40 stores modeling values of delay components until data is output according to the DLL clock CLK_DLL. A second reset signal RST_CLK is generated by reflecting a modeled delay value on the first reset signal RST_DLL.

The external clock counting unit 50 counts the external clock CLK_EXT in response to the second reset signal RST_CLK, and the latch unit 60 latches the output signals CNT_CLK<0:2> of the external clock counting unit 50 and outputs the external clock count value CNT_RD<0:2> in response to the read command RD.

The comparing unit 70 compares the DLL clock count value CNT_DLL<0:2> to the external clock count value CNT_RD<0:2> and activates the output enable signal OE when the two values are identical to each other.

FIG. 3 is a circuit diagram of the comparing unit 70 of FIG. 1.

Referring to FIG. 3, the comparing unit 70 is configured to compare the 3-bit DLL clock count value CNT_DLL<0:2> to the 3-bit external clock count value CNT_RD<0:2>. The comparing unit 70 outputs the output enable signal OE that is activated when the DLL clock count value CNT_DLL<0:2> is identical to the external clock count value CNT_RD<0:2>. The output enable signal OE is a signal, synchronized with the DLL clock CLK_DLL, that is activated using an initial count value corresponding to a CAS latency in the range from a minimum CAS latency to a maximum CAS latency. For reference, data are output according to the output enable signal OE and burst length information.

FIGS. 4 and 5 are signal timing diagrams illustrating the operation of the output enable signal generator of FIG. 1. Specifically, FIG. 4 illustrates a case where the CAS latency is 4. The operation of the output enable signal generator will be described with FIGS. 1 and 4.

Since the CAS latency is 4, the initial count value of the initializing unit 20 is set to 4, based on Table 1. When the first reset signal RST_DLL becomes logic low, the DLL clock counting unit 30 is responsive to the DLL clock CLK_DLL to output the DLL clock count value CNT_DLL<0:2> that is counted from the initial count value, that is, 4.

Meanwhile, when the second reset signal RST_CLK becomes logic low after the delay time of the delay model unit 40 is reflected on the first reset signal RST_DLL, the external clock counting unit 50 starts to count from zero in response to the external clock CLK_EXT.

At this point, when the read command RD is input, the latch unit 60 latches and outputs 2, which is the count value CNT_CLK<0:2> of the external clock CLK_EXT, as the external clock count value CNT_RD<0:2>. The comparing unit 70 compares the DLL clock count value CNT_DLL<0:2> with the external clock count value CNT_RD<0:2>. When the DLL clock count value CNT_DLL<0:2> is identical to the external clock count value CNT_RD<0:2>, that is, when the DLL clock count value CNT_RD<0:2> becomes 2, the comparing unit 70 activates the output enable signal OE. Data D0, D1, D2 and D3 are output to an external terminal DQ using the output enable signal OE.

FIG. 5 illustrates a case where the CAS latency is 5. The operation of the output enable signal generator will be described with reference to FIGS. 1 and 5.

Since the CAS latency is 5, the initial count value of the initializing unit 20 is set to 3, based on Table 1. When the first reset signal RST_DLL become logic low, the DLL clock counting unit 30 outputs the DLL clock count value CNT_DLL<0:2> that is counted from the initial count value, that is, 3.

Meanwhile, when the second reset signal RST_CLK becomes logic low after the delay time of the delay model unit 40 is reflected on the first reset signal RST_DLL, the external clock counting unit 50 starts to count the external clock CLK_EXT.

At this point, when the read command RD is input, the latch unit 60 latches and outputs 2, which is the count value CNT_CLK<0:2> of the external clock CLK_EXT, as the external clock count value CNT_RD<0:2>. The comparing unit 70 compares the DLL clock count value CNT_DLL<0:2> to the external clock count value CNT_RD<0:2>. When the DLL clock count value CNT_DLL<0:2> is identical to the external clock count value CNT_RD<0:2>, that is, when the DLL clock count value CNT_DLL<0:2> becomes 2, the comparing unit 70 activates the output enable signal OE. Data D0, D1, D2 and D3 are output to an external terminal DQ using the output enable signal OE.

The structure and operation of the conventional output enable signal generator have been described. Hereinafter, the weakness and problems of the conventional output enable signal generator will be described.

First, the CAS latency is a signal output from a mode register set. Thus, the initializing unit 20 has a limitation in that the initial count value is not set until the mode register set is set. In the operation of the semiconductor memory device, the initial count value must be changed by resetting the DLL clock counting unit 30 whenever the CAS latency is changed in a standby state such as a self-refresh operation.

In addition, as the fast circuit operation is required, an external clock CLK_EXT having higher frequency is used and thus the CAS latency is gradually increasing. Therefore, the counting capability of the DLL clock counting unit 30 and the external clock counting unit 50 must be expanded according to the CAS latency. For example, when the DLL clock counting unit 30 and the external clock counting unit 50 are implemented with 3-bit counters, the CAS latency can be ensured up to 7. If the CAS latency is further increased, the capability of the counters constituting the DLL clock counting unit 30 and the external clock counting unit 50 must also be expanded to more than 3 bits. The structure of the counters for the increased bit number causes more current consumption during an active or standby operation.

As the CAS latency increases, the bit number output from the DLL clock counting unit 30 and the external clock counting unit 50 increases. In this case, since the operation time of the comparing unit 70 increases, unwanted additional delay time is needed when generating the output enable signal. Consequently, the output enable signal cannot be generated at a desired time.

SUMMARY OF THE INVENTION

Embodiments of the present invention are directed to providing a semiconductor memory device, which is capable of generating a desired output enable signal without increasing an initial count value and bit number to be counted.

Embodiments of the present invention are also directed to providing a semiconductor memory device which is capable of generating a desired final output enable signal without unnecessary reset operations by reflecting CAS latency information on an external clock count value. The semiconductor memory device has optimal current consumption and minimum delay time in a domain crossing.

In accordance with an aspect of the present invention, there is provided a semiconductor memory device, which includes a first output enable signal generating unit configured to compare a first count value, which is obtained by counting a delay locked loop (DLL) clock, to a second clock count value, which is obtained by counting an external clock until a read command is input, and output a first output enable signal, and a final output enable signal generating unit configured to output, as a final output enable signal, either the first output enable signal or one of a plurality of output enable signals generated by shifting the first output enable signal, according to a column address strobe (CAS) latency.

In accordance with another aspect of the present invention, there is provided a method for operating a semiconductor memory device, which includes counting a delay locked loop (DLL) clock to output a first count value, counting an external clock until a read command is input to output a second count value, comparing the first count value to the second count value to output the first output enable signal, shifting the first output enable signal to generate a plurality of output enable signals in response to the DLL clock, and outputting, as a final output enable signal, either the first output enable signal or one of the plurality of output enable signals according to column address strobe (CAS) latency information.

In accordance with the embodiments of the present invention, the first output enable signal is generated using the counter having the constant initial count value, and the plurality of output enable signals are generated by shifting the first output enable signal. Then, one of the output enable signals can be output as the final output enable signal according to the CAS latency information. Therefore, the present invention can solve the problems that are caused by the initial count value changing according to the CAS latency. Furthermore, the output enable signal corresponding to the CAS latency is generated by comparing the first count value, which is obtained by counting the DLL clock from the predefined initial count value, to the second count value, which is obtained by reflecting the CAS latency information on the external clock count value. The generated output enable signal is then shifted to generate a plurality of output enable signals corresponding to the other CAS latencies. Therefore, the troublesomeness and problems of the reset operation of the first count value output unit can be solved and the desired final output enable signal can be generated.

DESCRIPTION OF SPECIFIC EMBODIMENTS

Hereinafter, a semiconductor memory device and a method for operating the same in accordance with the present invention will be described in detail with reference to the accompanying drawings.

Figure 1:
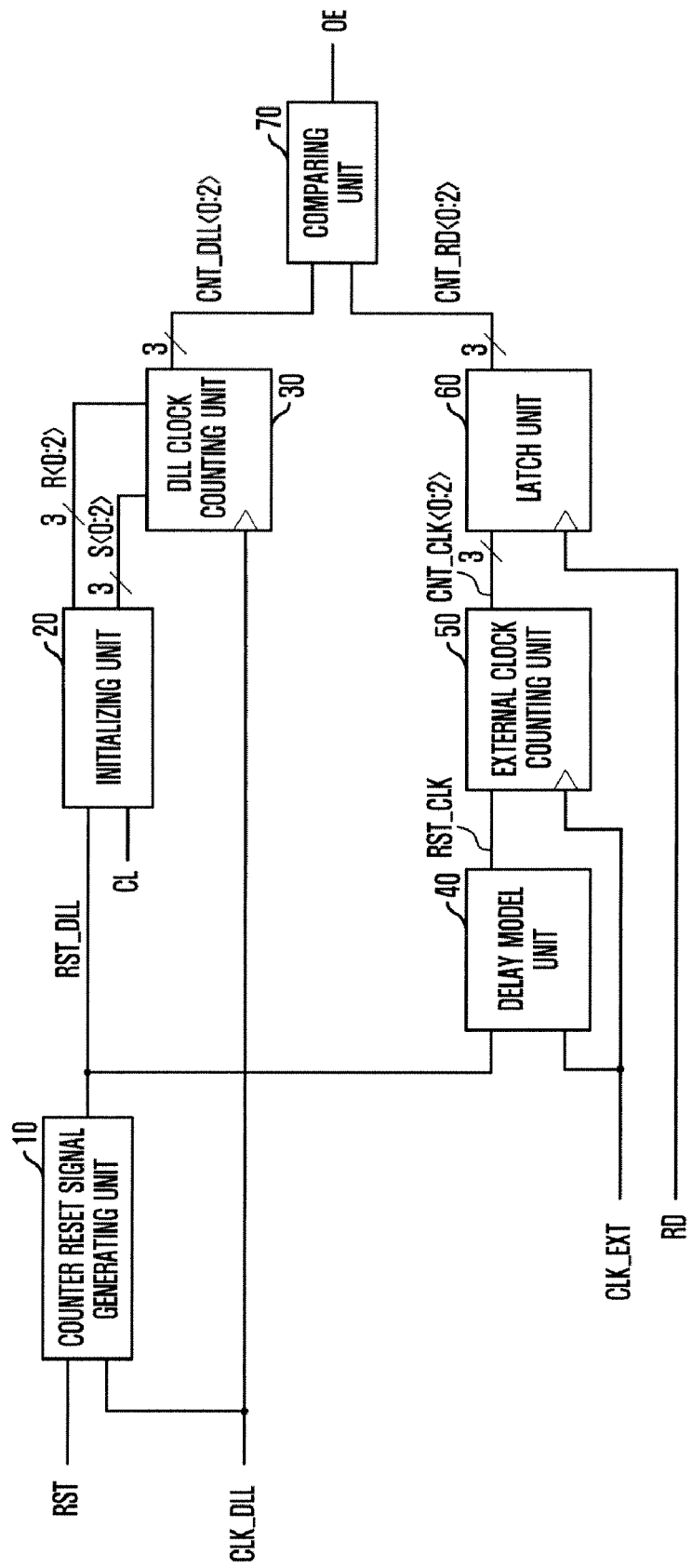
FIG. 1 is a block diagram of a conventional output enable signal generator.
Figure 2:
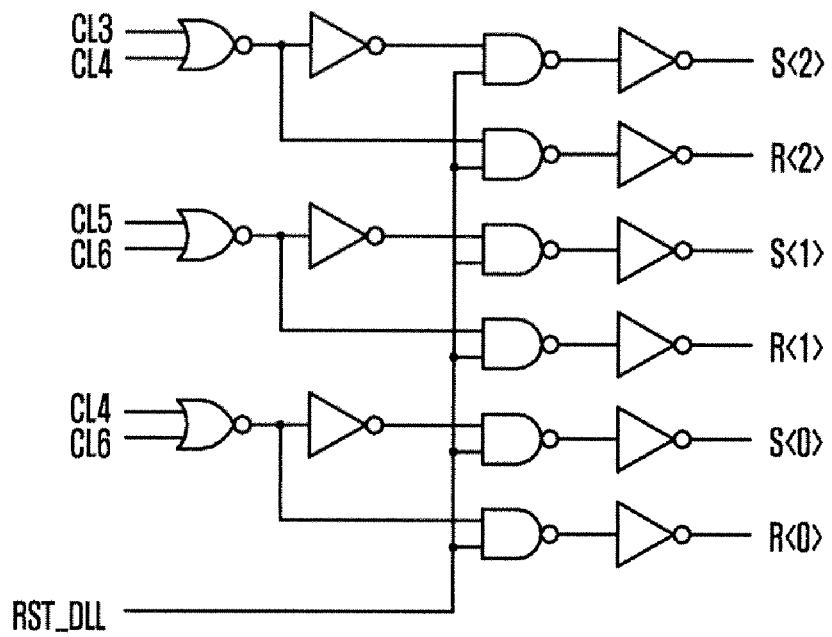
FIG. 2 is a circuit diagram of an initializing unit of FIG. 1.
Figure 3:
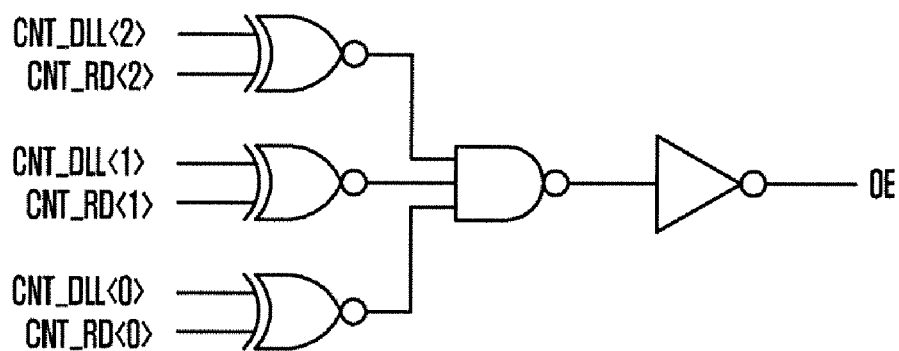
FIG. 3 is a circuit diagram of a comparing unit of FIG. 1.
Figure 4:
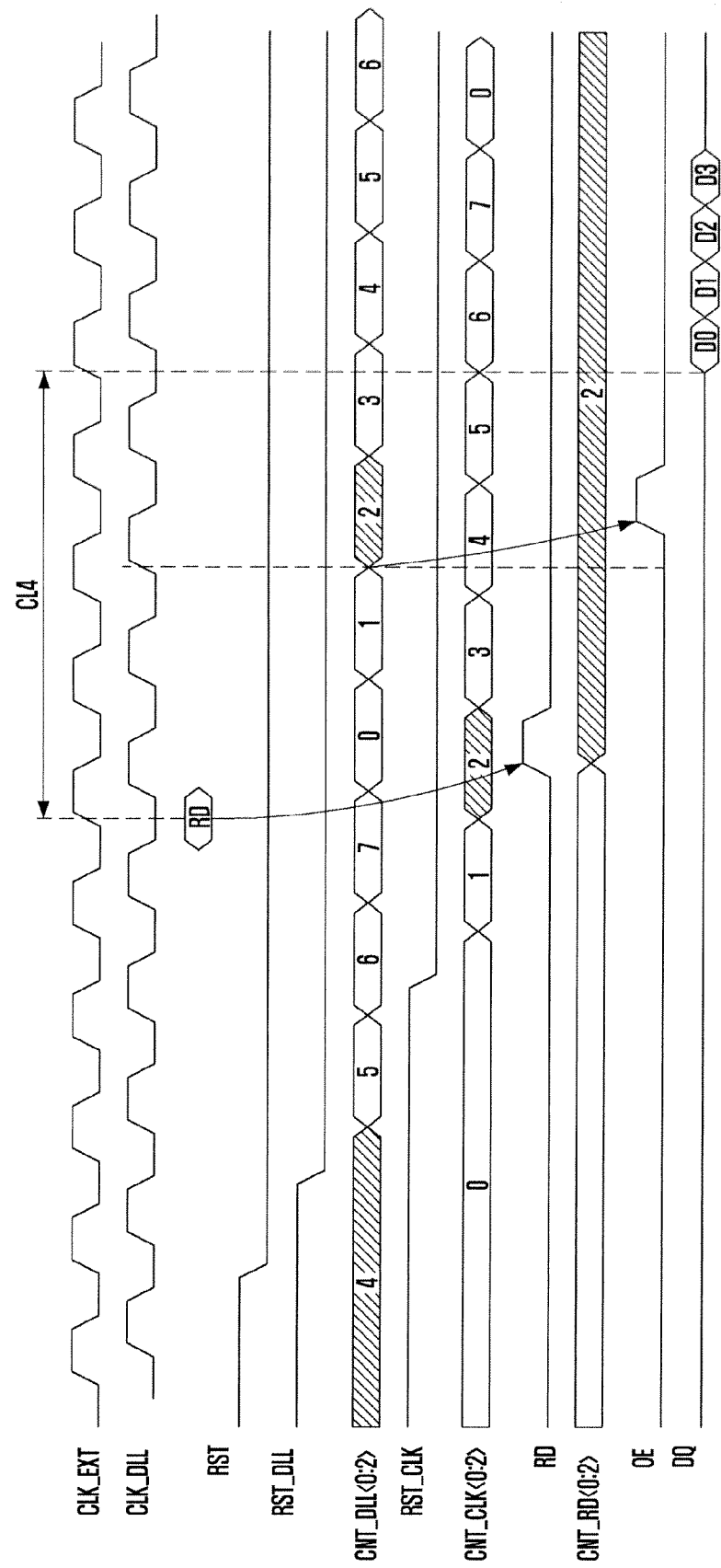
FIGS. 4 and 5 are signal timing diagrams illustrating the operation of the output enable signal generator of FIG. 1.
Figure 5:
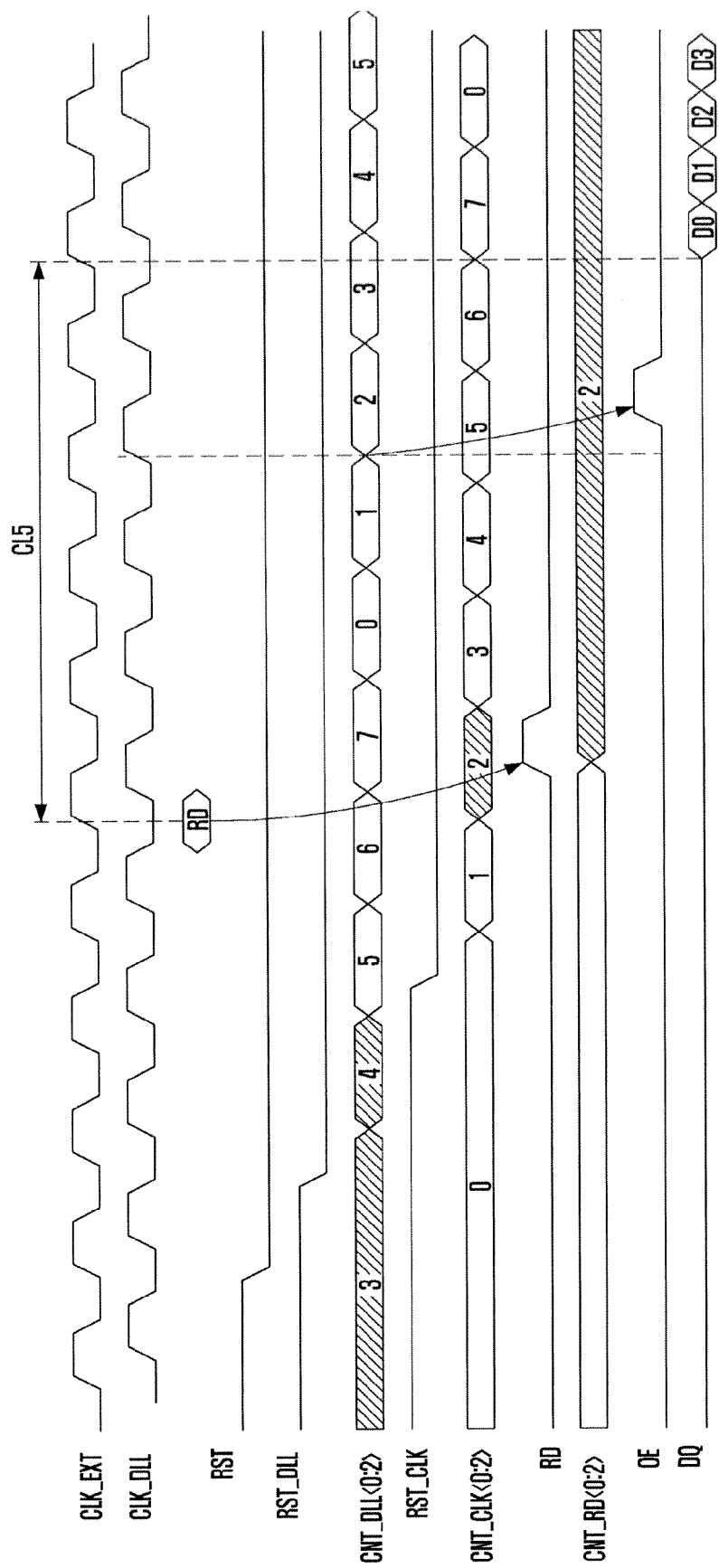
Figure 6:
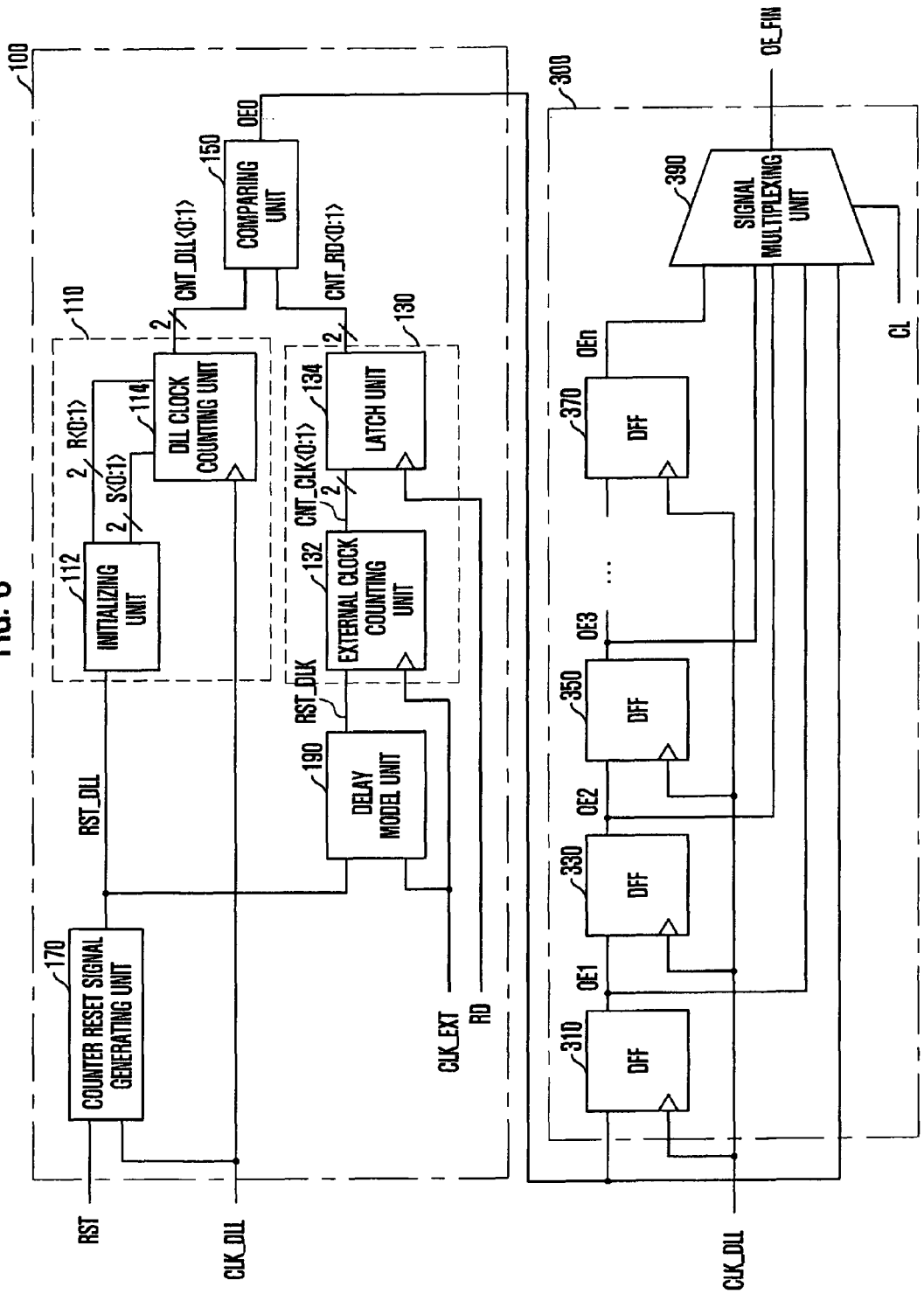
FIG. 6 is a block diagram illustrating an output enable signal generator of a semiconductor memory device in accordance with a first embodiment of the present invention.

FIG. 6 is a block diagram illustrating an output enable signal generator of a semiconductor memory device in accordance with a first embodiment of the present invention.

Referring to FIG. 6, the output enable signal generator includes a first output enable signal generating unit 100 and a final output enable signal generating unit 300. The first output enable signal generating unit 100 compares a DLL clock count value CNT_DLL<0:1> to an external clock count value CNT_RD<0:1> and generates a first output enable signal OE0. The DLL clock count value CNT_DLL<0:1> is obtained by counting a DLL clock CLK_DLL from a predefined initial count value, and the external clock count value CNT_RD<0:1> is obtained by counting an external clock CLK_EXT until a read command RD is input. The final output enable signal generating unit 300 outputs, as a final output enable signal OE_FIN, either the first output enable signal OE0 or one of a plurality of output enable signals OE1, OE2, . . . , OEn (where N is a natural number), which are generated by shifting the first output enable signal OE0, in response to the CAS latency CL.

More specifically, the first output enable signal generating unit 100 includes a first count value output unit 110, a second count value output unit 130, and a comparing unit 150. The first count value output unit 110 counts the DLL clock CLK_DLL from the predefined initial count value and outputs the DLL clock count value CNT_DLL<0:1>. The second count value output unit 130 counts the external clock CLK_EXT until the read command RD is input, and outputs the external clock count value CNT_RD<0:1>. The comparing unit 150 compares the DLL clock count value CNT_DLL<0:1> with the external clock count value CNT_RD<0:1> and outputs the first output enable signal OE0.

The output enable signal generator in accordance with the embodiment of the present invention may further include a counter reset signal generating unit 170 for generating a first reset signal RST_DLL in response to the DLL clock CLK_DLL and a reset signal RST corresponding to an external command (for example, /RAS, /CAS, /CS, or /WE).

The first count value output unit 110 includes an initializing unit 112 and a DLL clock counting unit 114. The initializing unit 112 provides an initial count value to the DLL clock counting unit 114 in response to the first reset signal RST_DLL output from the counter reset signal generating unit 170. The DLL clock counting unit 114 counts the DLL clock CLK_DLL from the initial count value to output the DLL clock count value CNT_DLL<0:1>. Herein, the DLL clock counting unit 114 is implemented with a 2-bit counter responsive to output signals S<0:1> and R<0:1> of the initializing unit 112. The DLL clock counting unit 114 may be designed to be responsive to the maximum count value that can be set at the early stage. That is, the DLL clock counting unit 114 may be implemented with a 2-bit counter that can count up to 4 when the maximum value of the initial count value is 4.

Figure 7:
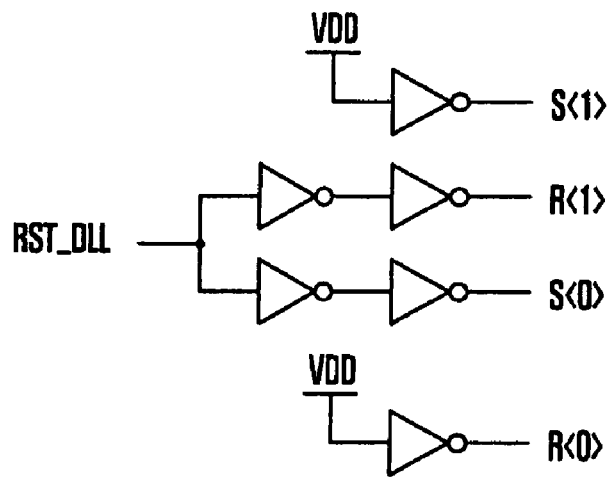
FIG. 7 is a circuit diagram of an initialing unit of FIG. 6.

FIG. 7 is a circuit diagram of the initialing unit 112 of FIG. 6.

Referring to FIG. 7, when the first reset signal RST_DLL is logic high (it is possible before the mode register set is set), the initializing unit 112 generates the output signals S<0:1> and R<0:1> for setting the initial count value of the DLL clock counting unit 114 to "1". Since the structure for setting the initial count value to "2" can be easily made with reference to FIG. 7 by those skilled in the art, its circuit configuration and description will be omitted.

In accordance with the embodiment of the present invention, the desired operation can be ensured even though the initial count value is not changed according to the CAS latency. Thus, the DLL clock counting unit 114 need not be reset even though the CAS latency is changed, which will be described in detail with reference to FIGS. 9 and 10.

Referring again to FIG. 6, the first output enable signal generating unit 100 may further include a delay model unit 190 configured to reflect the delay components of the DLL clock CLK_DLL on the first reset signal RST_DLL to generate a second reset signal RST_CLK for enabling the second count value output unit 130.

The second count value output unit 130 includes an external clock counting unit 132 and a latch unit 134. The external clock counting unit 132 counts the external clock CLK_EXT in response to the second reset signal RST_CLK output from the delay model unit 190. The latch unit 134 latches an output value CNT_CLK<0:1> of the external clock counting unit 132 in response to the read command RD to output the external clock count value CNT_RD<0:1>. Herein, the external clock counting unit 132 is implemented with a 2-bit counter. The external clock counting unit 132 may be implemented with a counter having the same bit number as the DLL clock counting unit 114.

Meanwhile, the DLL clock count value CNT_DLL<0:1> output from the DLL clock counting unit 114, the output value CNT_CLK<0:1> of the external clock counting unit 132, and the external clock count value CNT_RD<0:1> output from the latch unit 134 may have a plurality of bit signals, which can be changed according to its design.

Figure 8:
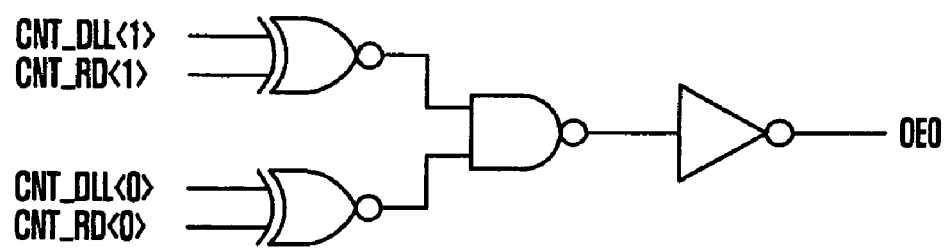
FIG. 8 is a circuit diagram of a comparing unit of FIG. 6.

FIG. 8 is a circuit diagram of the comparing unit 150 of FIG. 6.

Referring to FIG. 8, the comparing unit 150 is configured to compare the 2-bit DLL clock count value CNT_DLL<0:1> to the 2-bit external clock count value CNT_RD<0:1> and activate the first output enable signal OE0 when the two count values are identical to each other. The design of the comparing unit 150 may also be changed according to the bit number.

Referring again to FIG. 6, the final output enable signal generating unit 300 includes a plurality of shifting units 310, 330, 350 and 370 and a signal multiplexing unit 390. The plurality of shifting units 310, 330, 350 and 370 shift the first output enable signal OE0 in response to the DLL clock CLK_DLL. The signal multiplexing unit 390 outputs one of the first to n-th output enable signals OE0, OE1, . . . , OEn as the final output enable signal OE_FIN according to the CAS latency.

Although the plurality of shifting units 310, 330, 350 and 370 are implemented with D flip-flops in the above embodiment, they can also be implemented with other types of flip-flops or other circuits. In other words, the plurality of shifting units 310, 330, 350 and 370 have only to be designed to output the plurality of output enable signals OE1, OE2, OE3, . . . , OEn in synchronization with the DLL clock CLK_DLL. In addition, the signal multiplexing unit 390 may be implemented with a typical multiplexer.

Figure 9:
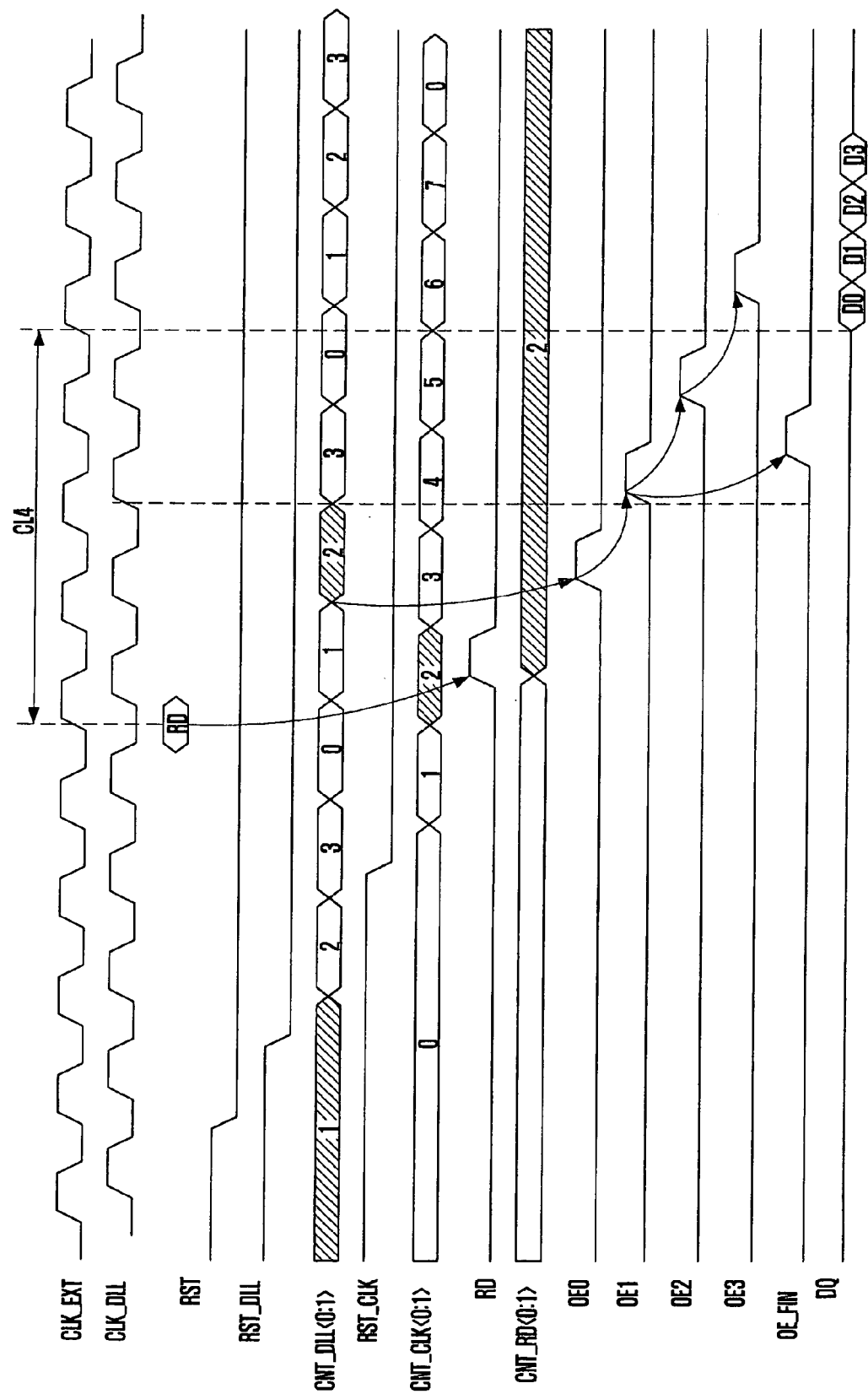
FIGS. 9 and 10 are signal timing diagrams illustrating the operation of the output enable signal generator of FIG. 6.
Figure 10:
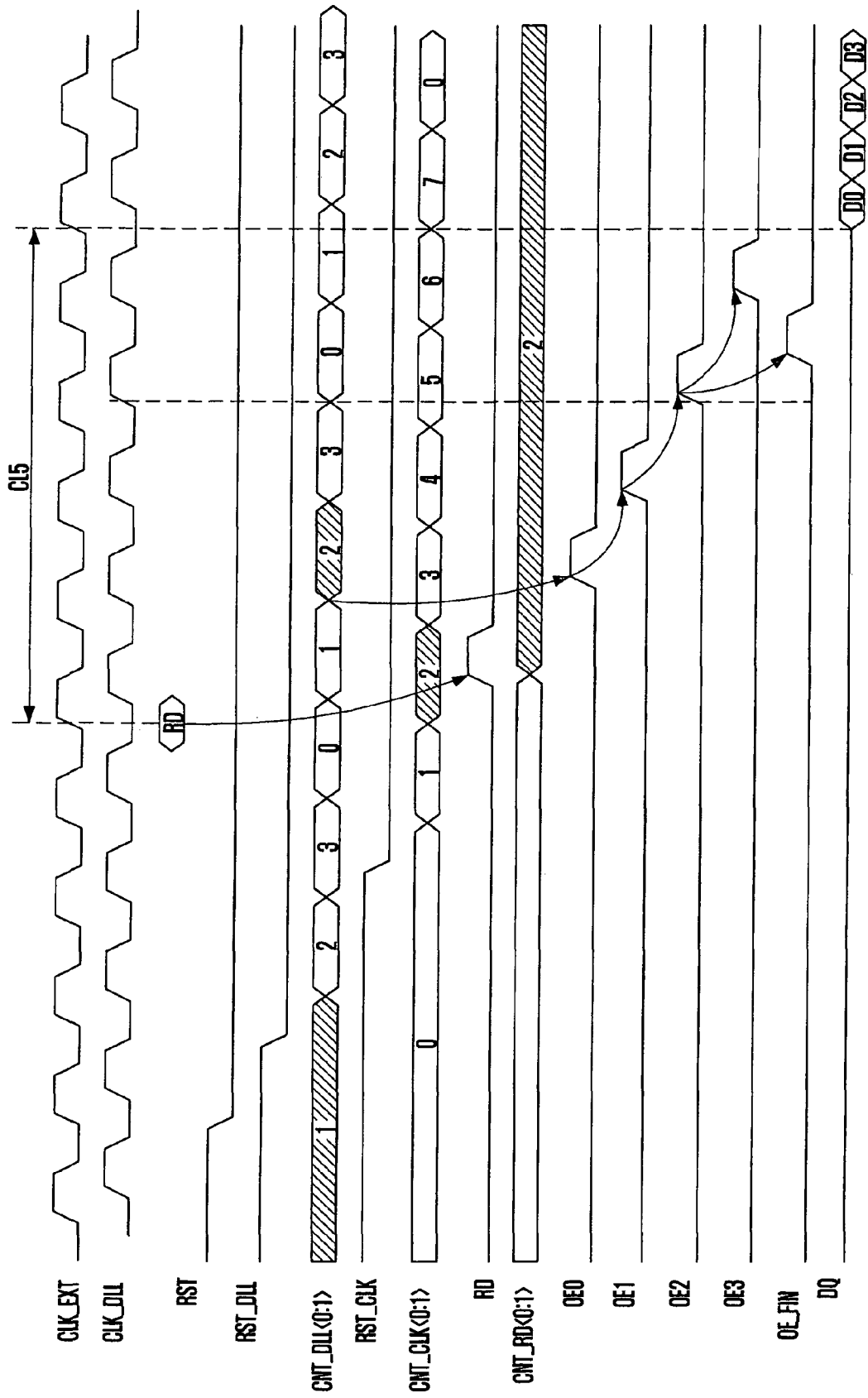

FIGS. 9 and 10 are signal timing diagrams illustrating the operation of the output enable signal generator of FIG. 6. Specifically, FIG. 9 illustrates a case where the CAS latency is 4. The operation of the output enable signal generator will be described with FIGS. 6 and 9.

The initial count value is set to 1 because it need not be changed whenever the CAS latency is changed.

When the first reset signal RST_DLL becomes logic low, the DLL clock counting unit 114 outputs the DLL clock count value CNT_DLL<0:1> that is counted from the initial count value, that is, 1. When the second reset signal RST_CLK becomes logic low after the delay time of the delay model unit 190 is reflected on the first reset signal RST_DLL, the external clock counting unit 132 starts to count the external clock CLK_EXT.

At this point, when the read command RD is input, the latch unit 134 latches and outputs 2, which is the count value CNT_CLK<0:1> of the external clock CLK_EXT, as the external clock count value CNT_RD<0:1>. The comparing unit 150 compares the DLL clock count value CNT_DLL<0:1> to the external clock count value CNT_RD<0:1>. When the DLL clock count value CNT_DLL<0:1> is identical to the external clock count value CNT_RD<0:1>, that is, when the DLL clock count value CNT_DLL<0:1> becomes 2, the comparing unit 150 outputs the first output enable signal OE0.

The plurality of shifting units 310, 330, 350 and 370 of the final output enable signal generating unit 300 generate the plurality of output enable signals OE1, OE2, . . . , OEn by shifting the first output enable signal OE0 in response to the DLL clock CLK_DLL. The signal multiplexing unit 390 outputs the final output enable signal OE_FIN in response to the CAS latency.

Herein, the second output enable signal OE1 is selected according to the CAS latency. The data D0, D1, D2 and D3 are output through the output terminal DQ using the selected second output enable signal OE1.

FIG. 10 illustrates a case where the CAS latency is 5. The operation of the output enable signal generator will be described with reference to FIGS. 6 and 10.

The initial count value is set to 1 because it need not be changed whenever the CAS latency is changed.

When the first reset signal RST_DLL becomes logic low, the DLL clock counting unit 114 outputs the DLL clock count value CNT_DLL<0:1> that is counted from the initial count value, that is, 1. When the second reset signal RST_CLK becomes logic low after the delay time of the delay model unit 190 is reflected on the first reset signal RST_DLL, the external clock counting unit 132 starts to count the external clock CLK_EXT.

At this point, when the read command RD is input, the latch unit 134 latches and outputs 2, which is the count value CNT_CLK<0:1> of the external clock CLK_EXT, as the external clock count value CNT_RD<0:1>. The comparing unit 150 compares the DLL clock count value CNT_DLL<0:1> to the external clock count value CNT_RD<0:1>. When the DLL clock count value CNT_DLL<0:1> is identical to the external clock count value CNT_RD<0:1>, that is, when the DLL clock count value CNT_DLL<0:1> becomes 2, the comparing unit 150 outputs the first output enable signal OE0.

The plurality of shifting units 310, 330, 350 and 370 of the final output enable signal generating unit 300 generate the plurality of output enable signals OE1, OE2, . . . , OEn by shifting the first output enable signal OE0 in response to the DLL clock CLK_DLL. The signal multiplexing unit 390 outputs the final output enable signal OE_FIN in response to the CAS latency.

Herein, the third output enable signal OE2 is selected according to the CAS latency. The data D0, D1, D2 and D3 are output through the output terminal DQ using the selected third output enable signal OE2.

Figure 11:
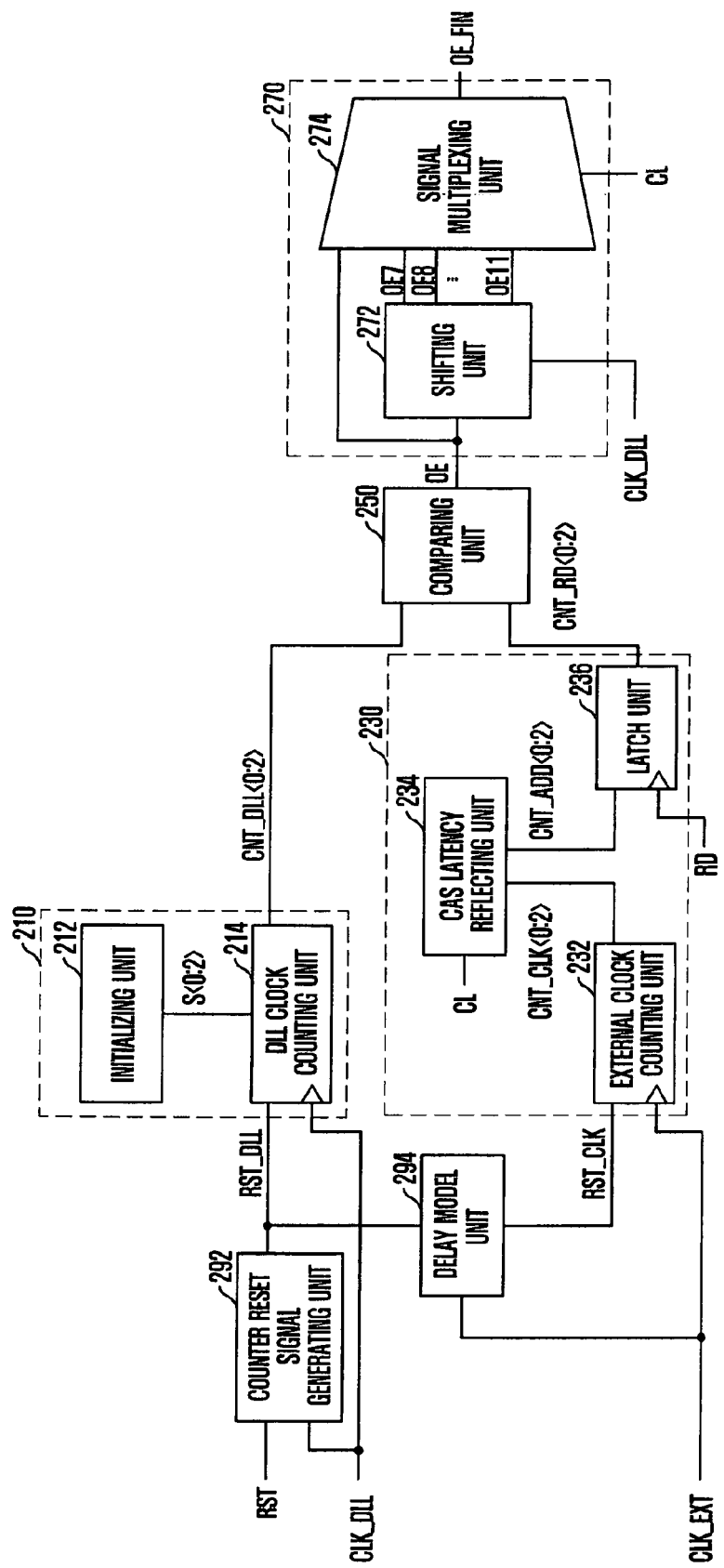
FIG. 11 is a block diagram illustrating an output enable signal generator of a semiconductor memory device in accordance with a second embodiment of the present invention.

FIG. 11 is a block diagram illustrating an output enable signal generator of a semiconductor memory device in accordance with a second embodiment of the present invention.

Referring to FIG. 11, the output enable signal generator differs from the output enable signal generator of FIG. 6 in that a first count value output unit 210 counts the DLL clock CLK_DLL from the predefined initial count value and outputs a DLL clock count value CNT_DLL<0:2>, and a second count value output unit 230 counts the external clock CLK_EXT until the read command RD is input and reflects the CAS latency on the count value to output an external clock count value CNT_RD<0:2>. The output enable signal generator will be described in detail, centering on the first count value output unit 210 and the second count value output value 230.

The first count value output unit 210 includes an initializing unit 212 and a DLL clock counting unit 214.

The initializing unit 212 provides an initial count value to the DLL clock counting unit 214. The DLL clock counting unit 214 is enabled in response to the first reset signal RST_DLL and counts the DLL clock CLK_DLL from the initial count value to output the DLL clock count value CNT_DLL<0:2>. Herein, like in the first embodiment of the present invention, the initial count value is set according to the maximum count value, which can be counted by the DLL clock counting unit 214, and the maximum CAS latency, which can be ensured by the output enable signal OE output from the comparing unit 250.

The second count value output unit 230 includes an external clock counting unit 232, a CAS latency reflecting unit 234, and a latch unit 236.

The external clock counting unit 232 is enabled in response to the second reset signal RST_CLK output from the delay model unit 294 and counts the external clock CLK_EXT from zero. The CAS latency reflecting unit 234 reflects the CAS latency on the output value CNT_CLK<0:2> of the external clock counting unit 232 to output a CAS latency reflection value CNT_CLK<0:2>. The latch unit 236 latches the CAS latency reflection value CNT_ADD<0:2> in response to the read command RD to output the external clock count value CNT_RD<0:2>. Herein, the external clock counting unit 232 may be designed corresponding to the DLL clock counting unit 214.

The CAS latency reflecting unit 234 will be described below in detail.

Figure 12:
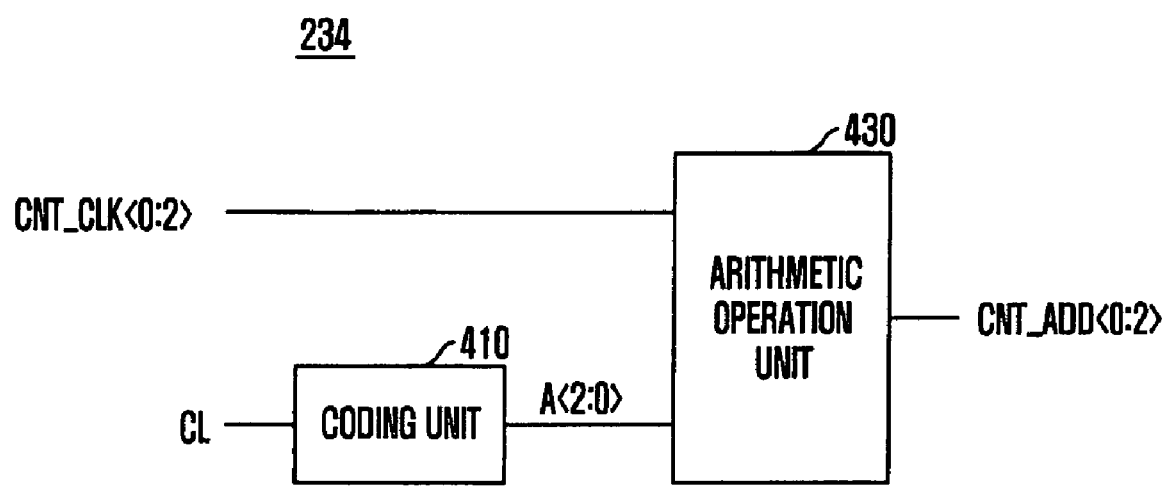
FIG. 12 is a block diagram of a CAS latency reflecting unit of FIG. 11.

FIG. 12 is a block diagram of the CAS latency reflecting unit 234 of FIG. 11.

Referring to FIGS. 11 and 12, the CAS latency reflecting unit 234 includes a coding unit 410 and an arithmetic operation unit 430 for performing an arithmetic operation on the output value CNT_CLK<0:2> of the external clock counting unit 232 and code values A<0:2> corresponding to the CAS latency. The CAS latency reflecting unit 234 configured as above can reflect the CAS latency on the output value CNT_CLK<0:2> of the external clock counting unit 232.

The coding unit 410 generates the code value A<0:2> corresponding to the CAS latency, and the arithmetic operation unit 430 sums the output value CNT_CLK<0:2> of the external clock counting unit 232 and the code value A<0:2>. The code value A<0:2> may be two's complement of the value corresponding to the CAS latency (see Table 2), and the arithmetic operation unit 430 sums the code value A<0:2> and the output value CNT_CLK<0:2> of the external clock counting unit 232.

TABLE 2

| CL | Corresponding value | Two's complement | A<2> | A<1> | A<0> |
|---|---|---|---|---|---|
| 6 | 0 | +000(0) | 0 | 0 | 0 |
| 5 | −1 | +111(7) | 1 | 1 | 1 |
| 4 | −2 | +110(6) | 1 | 1 | 0 |
| 3 | −3 | +101(5) | 1 | 0 | 1 |

In other words, the arithmetic operation unit 430 sums the output value CNT_CLK<0:2> of the external clock counting unit 232 and two's complement of the value corresponding to the CAS latency. The arithmetic operation unit 430 may be implemented with a typical adder or a carry look-ahead adder.

Consequently, the CAS latency reflecting unit 234 sums the output value CNT_CLK<0:2> of the external clock counting unit 232 and the code value A<0:2> corresponding to the CAS latency, and the latch unit 236 latches the CAS latency reflection value CNT_ADD<0:2> to output the external clock count value CNT_RD<0:2>. That is, the CAS latency is reflected on the external clock count value CNT_RD<0:2>.

According to related art, the counter must perform the reset operation according to the CAS latency. However, in accordance with the embodiment of the present invention, an unnecessary reset operation is eliminated by reflecting the CAS latency on the external clock count value CNT_RD<0:2>.

Figure 13:
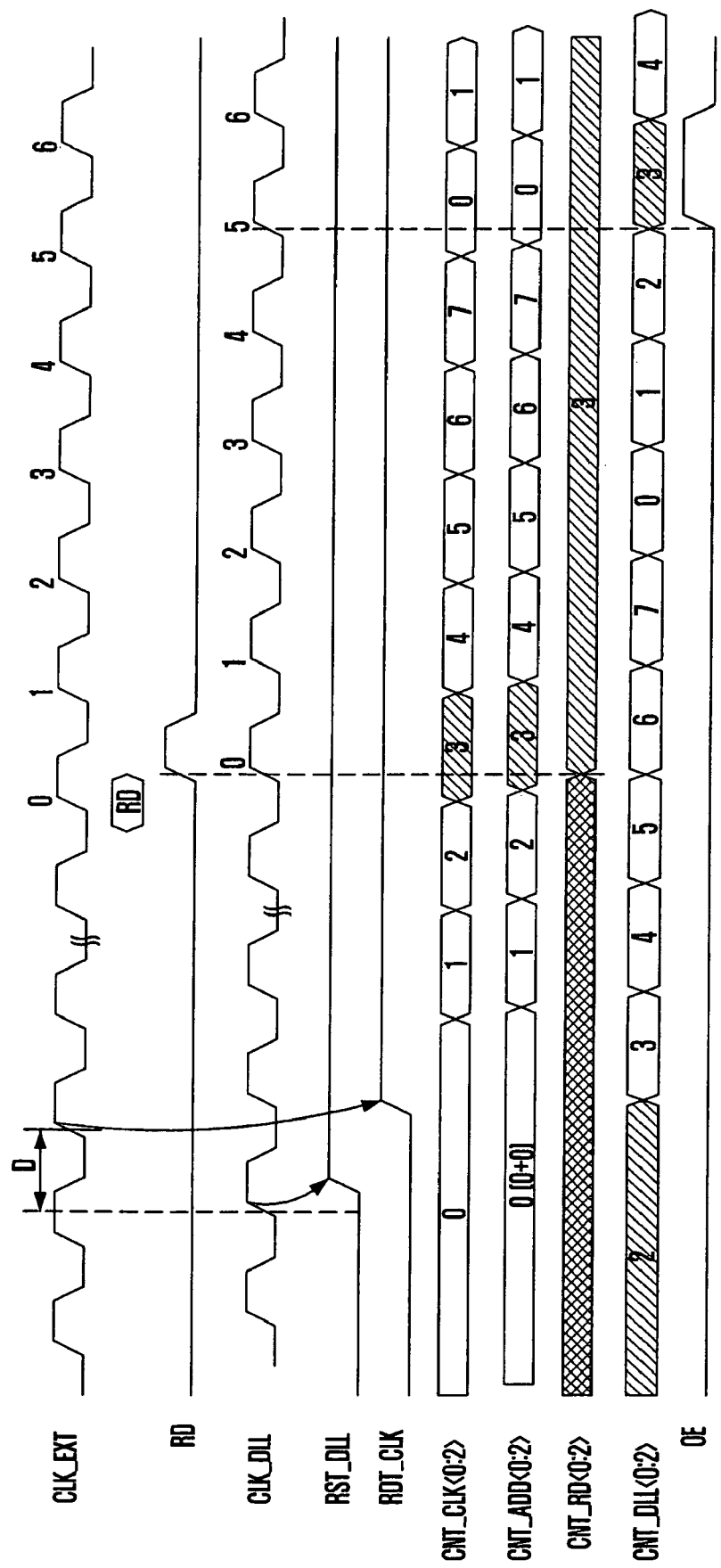
FIG. 13 is a signal timing diagram illustrating the operation of the output enable signal generator of FIG. 11.

FIG. 13 is a signal timing diagram illustrating the operation of the output enable signal generator of FIG. 11.

Specifically, FIG. 13 illustrates a case where the CAS latency is 6, that is, the output enable signal OE is generated in response to the fifth DLL clock and the initial count value is set to 2.

When the first reset signal RST_DLL becomes logic high (the active state of the reset signal may be different according to the setting), the DLL clock counting unit 214 outputs the DLL clock count value CNT_DLL<0:2> that is counted from the initial count value, that is, 2. When the second reset signal RST_CLK becomes logic high after the delay time of the delay model unit 249 is reflected on the first reset signal RST_DLL, the external clock counting unit 232 outputs the count value CNT_CLK<0:2> that is counted from zero. Since the CAS latency is 6, the CAS latency reflecting unit 234 sums zero and the output value CNT_CLK<0:2> of the external clock counting unit 232 to output the CAS latency reflection signal CNT_ADD<0:2>.

At this point, when the read command RD is input, the latch unit 236 latches and outputs 3, which is the CAS latency reflection value CNT_ADD<0:2>, as the external clock count value CNT_RD<0:2>. The comparing unit 250 compares the DLL clock count value CNT_DLL<0:2> to the external clock count value CNT_RD<0:2>. When the DLL clock count value CNT_DLL<0:2> is identical to the external clock count value CNT_RD<0:2>, that is, when the DLL clock count value CNT_DLL<0:2> becomes 3, the comparing unit 250 activates the output enable signal OE.

The generated output enable signal OE is selected as the final output enable signal OE_FIN in response to the CAS latency by the signal multiplexing unit 274. The data are output through the output terminal DQ using the selected output enable signal OE_FIN.

As described above, in outputting the first output enable signal, the 2-bit DLL clock count value CNT_DLL<0:1>, which is generated by counting the DLL clock CLK_DLL from the initial count value (which is set to 1 in FIGS. 9 and 10), is compared to the external clock count value CNT_RD<0:1>, which is generated by counting the external clock CLK_EXT until the read command RD is input. The generated first output enable signal OE0 is already synchronized with the DLL clock CLK_DLL.

In outputting the final output enable signal OE_FIN, a plurality of output enable signals OE1, OE2, . . . , OEn are generated by shifting the first output enable signal OE0 in response to the DLL clock CLK_DLL. The output enable signal corresponding to the CAS latency among the first output enable signal OE0 and the plurality of output enable signals OE1, OE2, . . . , OEn is output as the final output enable signal OE_FIN. The data are output using the final output enable signal OE_FIN.

In addition, the output enable signal OE corresponding to the CAS latency (less than 6) can be obtained by comparing the DLL clock count value CNT_DLL<0:2>, which is generated by counting the DLL clock CLK_DLL from the predefined initial count value, with the external clock count value CNT_RD<0:2>, on which the CAS latency is reflected. Furthermore, the plurality of output enable signals OE8, OE9, . . . , OE11 corresponding to the other CAS latencies (CL7 to CL11) can be obtained by shifting the output enable signal OE. Therefore, the final output enable signal OE_FIN corresponding to the CAS latency can be output.

Consequently, the final output enable signal OE_FIN can be generated even though the initial count value is not changed whenever the CAS latency is changed. Since the initial value output from the initializing unit can be set regardless of the setting of the mode register set, the DLL clock counting unit need not perform the reset operation according to the CA latency even though the CAS latency is changed. In addition, since the design of the DLL clock counting unit and the external clock counting unit need not be extended according to the CAS latency, the latch unit and the comparing unit also need not be additionally designed. Consequently, the current consumption in the active operation or the standby operation can be minimized, and the final output enable signal OE_FIN can be generated without unnecessary delay time.

As described above, since the constant initial count value is used even though the CAS latency is changed, the extended design of the counter is not needed. Therefore, the desired output enable signal can be generated without unnecessary current consumption and undesired delay time.

Furthermore, since the CAS latency information is reflected on the external clock count value, an unnecessary reset operation of the first count value output unit can be prevented even though the CAS latency is changed, thereby solving the troublesomeness and problems of the reset operation.

While the present invention has been described with respect to the specific embodiments, it will be apparent to those skilled in the art that various changes and modifications may be made without departing from the spirit and scope of the invention as defined in the following claims.

Although the domain crossing of the DLL clock and the external clock has been exemplary described in the above embodiments, the present invention can also be applied to a domain crossing of different clocks.

What is claimed is:

1. A semiconductor memory device, comprising:
  a first output enable signal generating unit configured to
    compare a first count value, which is obtained by counting a delay locked loop (DLL) clock, with a second clock count value, which is obtained by counting an external clock until a read command is input, and output a first output enable signal; and a final output enable signal generating unit configured to output a final output enable signal by selecting one of the first output enable signal and a plurality of output enable signals in response to a column address strobe (CAS) latency, the plurality of output enable signals being generated by shifting the first output enable signal.

2. The semiconductor memory device as recited in claim 1, wherein the first output enable signal generating unit includes:

a first count value output unit configured to count the DLL clock and output the first count value;

a second count value output unit configured to count the external clock until the read command is input, and output the second count value; and a comparing unit configured to compare the first count value with the second count value and output the first output enable signal.

3. The semiconductor memory device as recited in claim 2, further including a reset signal generating unit configured to generate a first reset signal for enabling the first count value output unit in response to the DLL clock and a signal corresponding to an external command.

4. The semiconductor memory device as recited in claim 3, wherein the first count value output unit includes:

an initializing unit configured to provide an initial count value in response to the first reset signal; and a DLL clock counting unit configured to count the DLL clock from the initial count value to output the first count value.

5. The semiconductor memory device as recited in claim 3, wherein the first count value output unit including:

an initializing unit configured to provide the initial count value; and a DLL clock counting unit enabled in response to the first reset signal to count the DLL clock from the initial count value to output the first count value.

6. The semiconductor memory device as recited in claim 4, wherein the initial count value is set according to the CAS latency and a maximum count value of the DLL clock counting unit.

7. The semiconductor memory device as recited in claim 3, further comprising a delay model unit configured to reflect a delay component of the DLL clock on the first reset signal to generate a second reset signal for enabling the second count value output unit.

8. The semiconductor memory device as recited in claim 7, wherein the second count value output unit includes:

an external clock counting unit configured to count the external clock in response to the second reset signal; and a latch unit configured to latch an output value of the external clock counting unit in response to the read command and output the second count value.

9. The semiconductor memory device as recited in claim 7, wherein the second count value output unit includes:

an external clock counting unit enabled in response to the second reset signal to count the external clock;

a CAS latency reflecting unit configured to reflect the CAS latency on an output value of the external clock counting unit; and a latch unit configured to latch an output value of the CAS latency reflecting unit in response to the read command to output the second count value.

10. The semiconductor memory device as recited in claim 9, wherein the CAS latency reflecting unit performs an arithmetic operation on the output value of the external clock counting unit and a value corresponding to the CAS latency.

11. The semiconductor memory device as recited in claim 9, wherein the CAS latency reflecting unit includes:

a coding unit configured to generate a code value corresponding to the CAS latency; and an arithmetic operation unit configured to perform an arithmetic operation on the code value and the output value of the external clock counting unit.

12. The semiconductor memory device as recited in claim 2, wherein the first count value and the second count value includes a plurality of bit signals.

13. The semiconductor memory device as recited in claim 1, wherein the final output enable signal generating unit includes:

a plurality of shifting units configured to shift the first output enable signal to output the plurality of output enable signals in response to the DLL clock; and a signal multiplexing unit configured to output the final output enable signal by selecting one of the first output enable signal and the plurality of output enable signals in response to the CAS latency.

14. The semiconductor memory device as recited in claim 13, wherein the plurality of shifting units includes a plurality of D flip-flops.

15. The method for operating a semiconductor memory device, the method comprising:

counting a delay locked loop (DLL) clock to output a first count value;

counting an external clock, until a read command is input, to output a second count value;

comparing the first count value with the second count value to output the first output enable signal;

shifting the first output enable signal to generate a plurality of output enable signals in response to the DLL clock; and outputting a final output enable signal by selecting one of the first output enable signal and the plurality of output enable signals according to a column address strobe (CAS) latency information.

16. The method as recited in claim 15, further comprising generating a first reset signal for enabling the operation of outputting the first count value in response to the DLL clock and a signal corresponding to an external command.

17. The method as recited in claim 6 wherein the outputting of the first count value includes:

providing an initial count value in response to the first reset signal; and counting the DLL clock from the initial count value.

18. The method as recited in claim 16, wherein the outputting of the first count value includes:

providing the initial count value; and counting the DLL clock from the initial count value in response to the first reset signal.

19. The method as recited in claim 16, further comprising reflecting a delay component of the DLL clock on the first reset signal to generate a second reset signal for enabling the operation of outputting the second count value.

20. The method as recited in claim 19, wherein the outputting of the second count value includes:

counting the external clock in response to the second reset signal; and latching the count value of the external clock in response to the read command to output the second count value.

21. The method as recited in claim 19, wherein the outputting of the second count value includes:
   counting the external clock in response to the second reset signal;
   reflecting the CAS latency information on the count value of the external clock; and
   latching a value obtained from the operation of reflecting the CAS latency information in response to the read command to output the second count value.

22. The method as recited in claim 21, wherein the reflecting of the CAS latency information includes performing an arithmetic operation on the count value of the external clock and a code value corresponding to the CAS latency information.

23. The method as recited in claim 21, wherein the reflecting of the CAS latency information includes:
   generating a code value corresponding to the CAS latency information; and
   performing the arithmetic operation on the count value of the external clock and the code value.

24. The method as recited in claim 17, wherein the initial count value is set according to the CAS latency information and a maximum count value output during the operation of outputting the first count value.

* * * * *